United States Patent [19]

Richards et al.

[11] 4,388,590

[45] Jun. 14, 1983

[54] DIGITAL AUDIO LEVEL METERING

[75] Inventors: John W. Richards, Chalfont St. Peter; Ian Craven, Fulham, both of England

[73] Assignee: EMI Limited, Hayes, England

[21] Appl. No.: 165,762

[22] Filed: Jul. 3, 1980

[30] Foreign Application Priority Data

Jul. 7, 1979 [GB] United Kingdom ................. 7923799

[51] Int. Cl.³ ............................................. G01R 19/16
[52] U.S. Cl. ............................ 324/103 P; 179/1 MN;
 307/351; 324/120
[58] Field of Search ................. 324/103 P, 120, 99 D;
 307/351; 179/1 MN, 1 N

[56] References Cited

U.S. PATENT DOCUMENTS 3,924,078 12/1975 Bussey ............................ 324/103 P

FOREIGN PATENT DOCUMENTS 1468292 3/1977 United Kingdom .

Primary Examiner—Ernest F. Karlsen
Attorney, Agent, or Firm—Fleit, Jacobson & Cohn

[57] ABSTRACT

An arrangement which displays an indication of the amplitude level of digital audio signals. The arrangement includes an acquisition means which receives digital audio signals and determines the peak amplitude value of the signals received between successive interrogations by a control means, and at least this value is indicated by a display means. If the currently indicated value exceeds the last determined value, then the indicated value is caused to decay at a predetermined rate.

9 Claims, 6 Drawing Figures

| LED No. | LEVEL |
|---|---|
| 1 | −0.56 dB AND ERR LED |
| 2 | −1.16 dB |
| 3 | −1.80 dB |
| 4 | −2.4 dB |
| 5 | −3.25 dB |
| 6 | −4.0 dB |
| 7 | −5.0 dB |
| 8 | −6.0 dB |
| 9 | −7.1 dB |
| 10 | −8.5 dB |
| 11 | −10.1 dB |
| 12 | −12.0 dB |
| 13 | −14.5 dB |
| 14 | −18.0 dB |
| 15 | −24.0 dB |

FIG.5a

| 1 | ERR LED |
|---|---|
| 2 | −6 dB |
| 3 | −12 dB |
| 4 | −18 dB |
| 5 | −24 dB |
| 6 | −30 dB |
| 7 | −36 dB |
| 8 | −42 dB |

FIG.5b

DIGITAL AUDIO LEVEL METERING

This invention relates to level displays for digital audio systems, and in particular, although not exclusively to level displays for use in a digital mixing console.

It is necessary to meter the level of audio signals in one or more channels of an audio mixing console, at both the input to the console to avoid overloading a channel, and at the output to avoid overloading the apparatus arranged to receive the signals, for example a tape recorder.

In an analogue system, these two overload conditions have different effects. The onset of overloading at the input is clearly defined and results in "hard limiting", or "clipping" of the signal waveform. This distorts the input signal, and harmonics and intermodulation frequencies are produced. At the output in a receiving apparatus (e.g. a tape machine), however, the onset of overloading is less clearly defined and the resulting distortion is progressive, a condition known as "soft limiting". In contrast, in a digital mixing console, both the input to a channel, and the output in a receiving apparatus (e.g. a digital tape machine) suffer from "hard limiting" due to the onset of code overloading.

In professional analogue mixing consoles, since the signal to noise ratio is relatively large, it is convenient to provide a sufficiently large overload margin, or "head room" to allow for the problem of "hard limiting". It is then usual to use conventional VU meters to provide the sound engineer with a visual indication of the output signal level, to permit a meaningful interpretation of the quality of a sound recording.

Due, however, to the limited dynamic range of the converters used in a digital console, the technique of providing a large overload margin to overcome the problem of "hard limiting" is not advisable, since this would inevitably degrade the signal to noise figure of the system. Furthermore, any form of VU (or PPM) metering at the output from or at the input to a digital channel would be both inconvenient and expensive, since digital to analogue conversion is necessary for such an analogue implementation.

It is desirable, therefore, to provide a display system for digital implementation, which may be used at both the input and output stages of the console and which is meaningful both in terms of channel distortion and noise. Preferably, the display should also have the appearance of a conventional analogue bargraph type UV meter.

It is an object of this invention to provide such a digital display system, substantially satisfying the above mentioned criteria.

According to the invention there is provided an arrangement for displaying a visual indication of the amplitude level of digital audio signals comprising, an acquisition means for receiving digital audio signals and for generating therefrom further digital signals representative of the amplitude of signals received between successive periodic interrogations thereof, control means for performing said interrogations and for transmitting said further signals to a display location, and a display means comprising an input means, disposed at said display location, for receiving said transmitted further signals, means for providing a visual indication of the amplitude level represented by said further signals, and means for causing said indicated value to decay at a predetermined rate if greater than the amplitude level represented by a signal subsequently transmitted to the input means, and to be substituted thereby if less.

The control means may periodically interrogate said acquisition means at intervals lying in the range 320 $\mu$S to 1280 $\mu$S.

The means for causing the decay or substitution may comprise a first counter means for storing the indicated amplitude value, means for storing the amplitude value of a subsequently received signal, means for comparing said values a second counter means for reducing the indicated value at a predetermined rate if greater than the value stored in said storage means and means for permitting substitution of the indicated value by the value stored in said storage means if less.

The means for providing the visual indication of the amplitude level represented by said further signals comprises a plurality of light emitting indicators, such indicator being identified with an amplitude level.

The light emitting indicators may be energised by a further counter means responsive to the value stored in the first counter. The decay may be logarithmic or linear.

In order that the invention may be more readily understood embodiments thereof will be described by reference to the accompanying drawings of which:

FIGS. 5a and 5b show two alternative forms of display.

The following description relates specifically to a system having 256 channels to which digital audio data is transmitted in a 16 bit 2'S complement form, the least significant bit appearing first. It will be appreciated, however, that the present invention is not limited to this particular example and larger or smaller systems, supplied with data in an alternative form, may readily be envisaged by a person skilled in the art.

The three basic components of the invention are represented by references A, B and C in FIG. 1, and each element will be described in detail by reference to FIGS. 2, 3 and 4 respectively.

Figure 1:
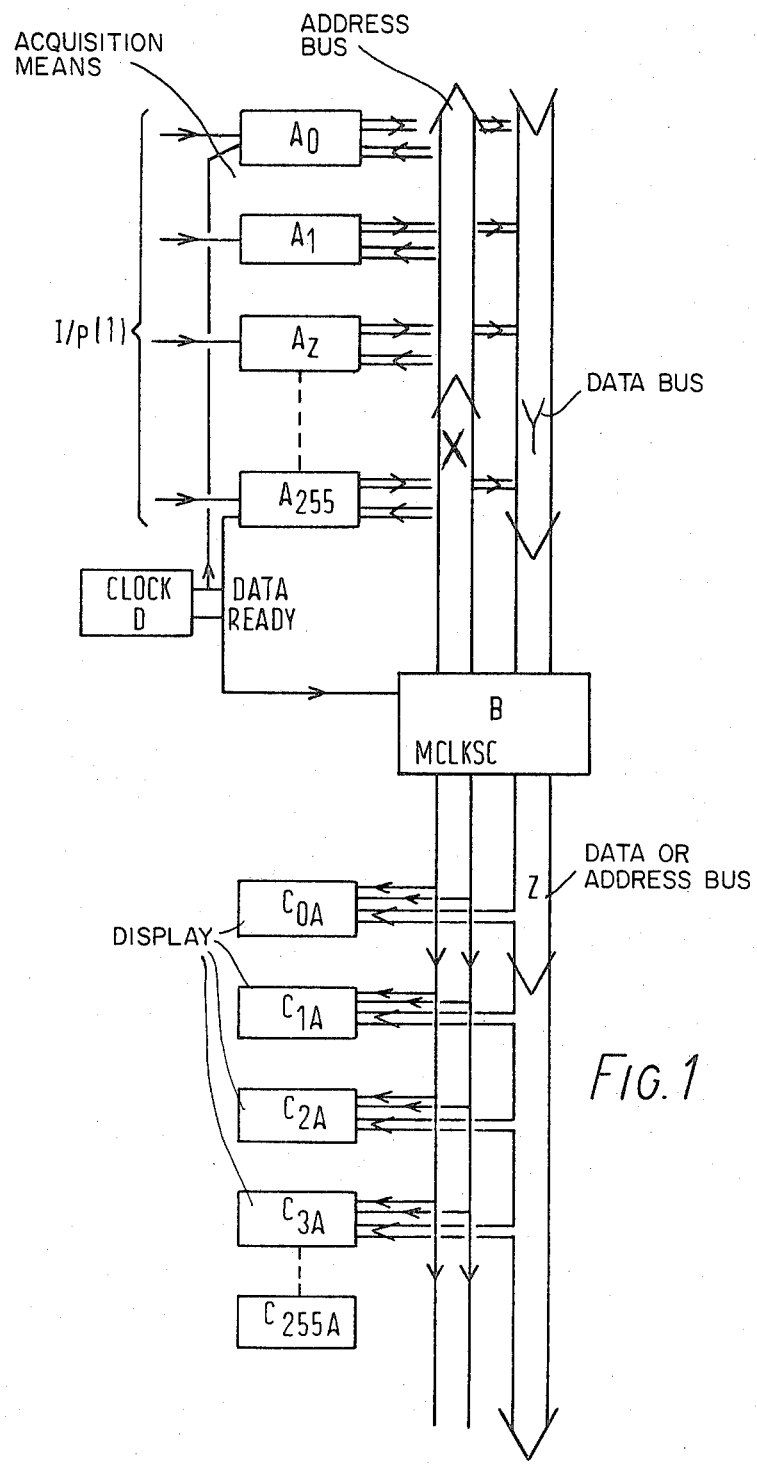
FIG. 1 shows the general layout of the system.

Referring firstly to FIG. 1, each channel in the system has an acquisition means Ar, (i.e., Ao to A255) which receives samples (each 16 bits long) periodically via one of the inputs at I/p. Control means, B, then sequentially interrogates each acquisition means, Ar, by application thereto of a suitable 8 bit address along an address bus, X. The peak amplitude values Vp, of samples received between successive interrogations is then transmitted to the control means, B, along a data bus, Y.

The control means, B, then addresses the corresponding display means, Cr, and transmits the value, Vp, along a common 8 bit data or address bus, Z, for display. The interval between interrogations is organised by the clocking means, D.

Since the number of bits transferred in this system is relatively small (i.e. no more than 8) it is convenient to use parallel data or address buses. However, in larger systems it may be more practicable to use serial address or data buses in conjunction with serial to parallel conversion in each unit.

Figure 2:
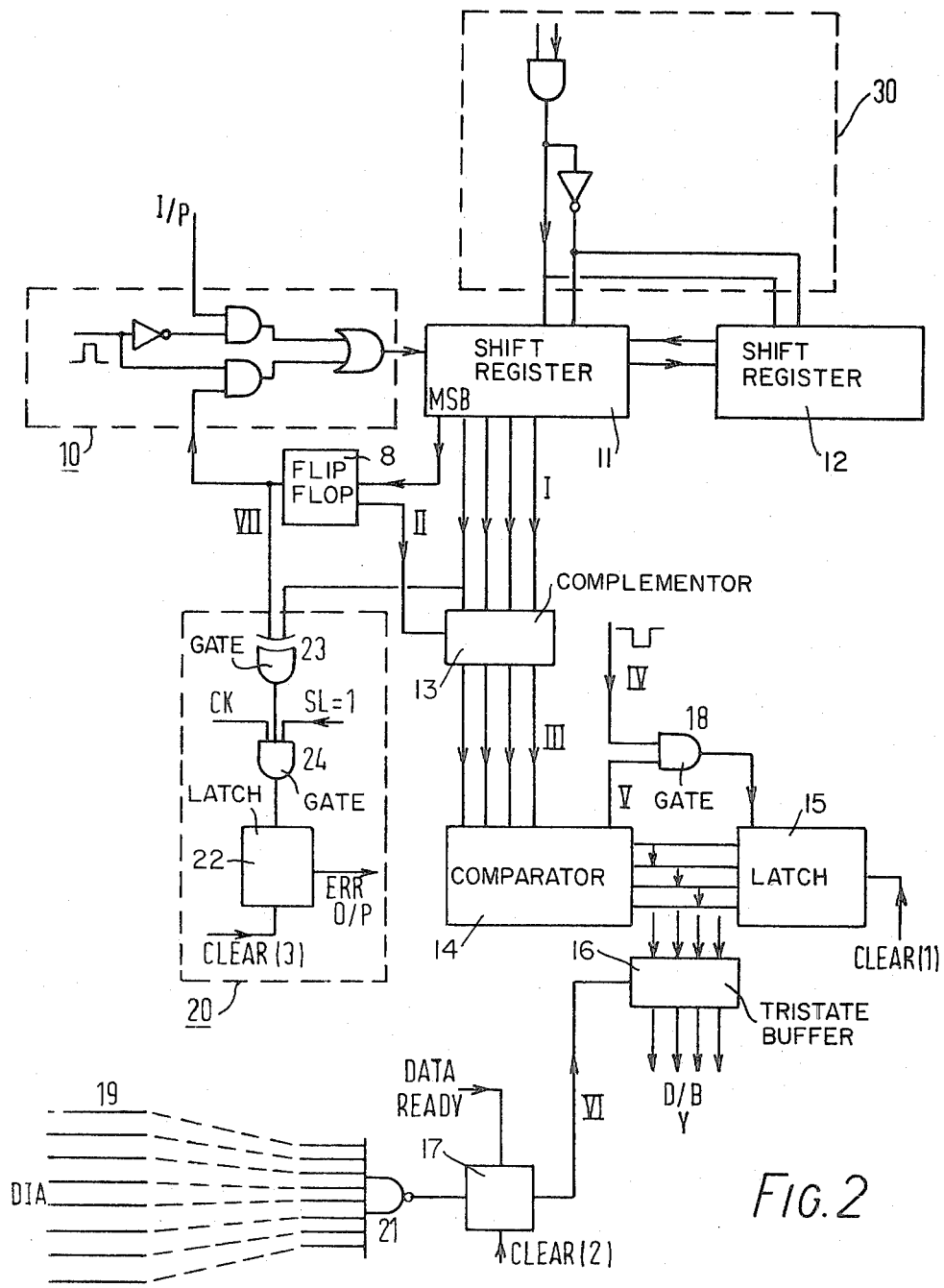
FIG. 2 shows an acquisition means, Ar, of FIG. 1.

Referring now to FIG. 2, each 16 bit data sample is clocked, in serial fashion, from an input at I/p into two shift registers, 11 and 12, during the first half of each sampling period. As will be more fully explained later, 11 and 12 may be universal shift registers. In the present example a sampling period of 20 μS is used, although, of course, other values could be used to suit a particular situation; sampling periods of between 10 μS and 150 μS may be convenient. The clocking means has not been indicated in FIG. 2, but will be readily envisaged by a person skilled in the art.

After clocking, the first five most significant bits are available in parallel form at the output of 11. These are indicated at I. The most significant bit (MSB) in this example is a polarity bit, and this is taken to a "D" type flip-flop, 8, where it is stored for further use.

An output, II, from flip-flop 8 (this will be a "1" for sampled signals having a −ve value) is then used to control a conditional complementor, 13, the output, III, of which represents the binary absolute amplitude value of the first five most significant bits of the input at I/p.

A magnitude comparator, 14, compares this value with a peak amplitude value, P, due to a previous sample, already stored in quad latch, 15. If the value at 13 exceeds the value P, stored at 15, a pulse V is generated at the output of the magnitude comparator 14. This pulse is used in conjunction with a pulse IV to cause gate 18 to enable the quad latch 15 to thereby replace the value P with the new peak value stored at 13.

Clock D, in FIG. 1, periodically (i.e. every 32 sampling periods) generates a DATA READY pulse at a point in the sampling period when the data is stable in the quad latch, 15, of each acquisition means, Ar. This causes the control means, B, to suquentially interrogate each of the circuits Ar by putting an address, DIA, unique to a particular circuit, onto the address bus, X, shown in FIG. 1.

The address, DIA, carried by bus, X, is received by each circuit Ar at, 19, decoded, and compared at 21 with the address expected for the particular circuit considered. If the received address matches the expected address and the DATA READY pulse has been received then a pulse, VI, from chip 17, enables the data (i.e. the peak amplitude value determined since the last interrogation) stored in, 15, onto the data bus, Y, via a tristate buffer, 16. This data is then passed along the bus to the control means, B. Latch, 22, (which will be discussed below) and latch, 15, are then reset to zero so that the peak amplitude level may be redetermined before the next interrogation by the control means.

In this manner each acquisition means is periodically interrogated by the control means, and this occurs for each circuit once every 256 DATA READY pulses, since only then is the address unique to a particular circuit accessed to the address bus, X.

The peak amplitude value determined by a circuit, Ar, during the period since its last interrogation is received by the control means which then reformats the data for distribution to the corresponding display means, Cr.

It may be that for some applications a value other than the peak amplitude value (for example the mean amplitude value) is preferred and alternative circuitry to achieve this will be readily envisaged by a person skilled in the art.

Figure 3:
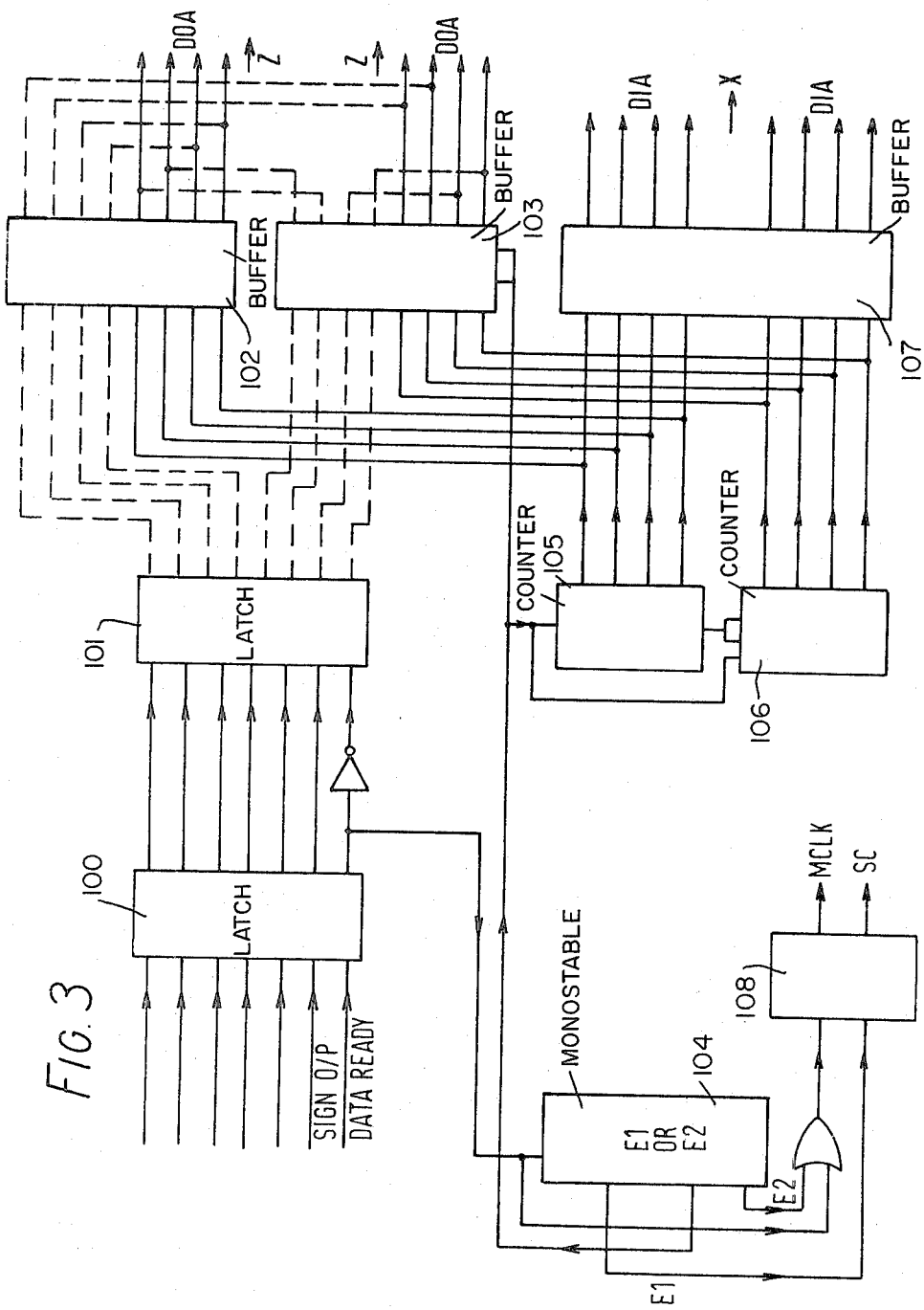
FIG. 3 shows the control means indicated at, B, in FIG. 1.

Referring now to FIG. 3, which shows the control means, B, the incoming DATA READY pulse is used to latch the data on bus, Y, as selected by the address on bus, X, into latch, 101, via latch, 100, and to "fire" a first pulse, E1, of a dual monostable, 104, to generate a control signal, SC. This control signal enables the address, currently in an 8 bit counter (105, 106), onto the address bus, Z, via tristate buffers 102, and 103. This address, DOA, is indicated by the solid lines at the output of the buffers.

The address, DIA, which is enabled onto the address bus, X, to select an appropriate acquisition means, Ar, passes from the control means via buffers 107, as indicated in FIG. 3.

The control signal, SC, is relayed to each of the display circuits to indicate that the address has been enabled to bus, Z, and a delayed version of the DATA READY pulse is applied to the MCLK output to "set up" the display circuit addressable ports which match the current address, DOA, in readiness to receive the data.

As soon as the first pulse, E1, from monostable, 104, goes low the counter (105, 106) is incremented to the next address in readiness or the next cycle and the data in latch, 101, is transferred via tristate buffers, 102 and 103, onto the data bus, Z, as indicated by the dashed lines in FIG. 3. In this example, of course, a common address and data bus is used.

Finally a second MCLK pulse, E2, is generated by monostable, 104, to latch the data now on bus Z to the input of the selected display means, which, as described earlier, has already been "set up" using the first MCLK pulse.

Figure 4:
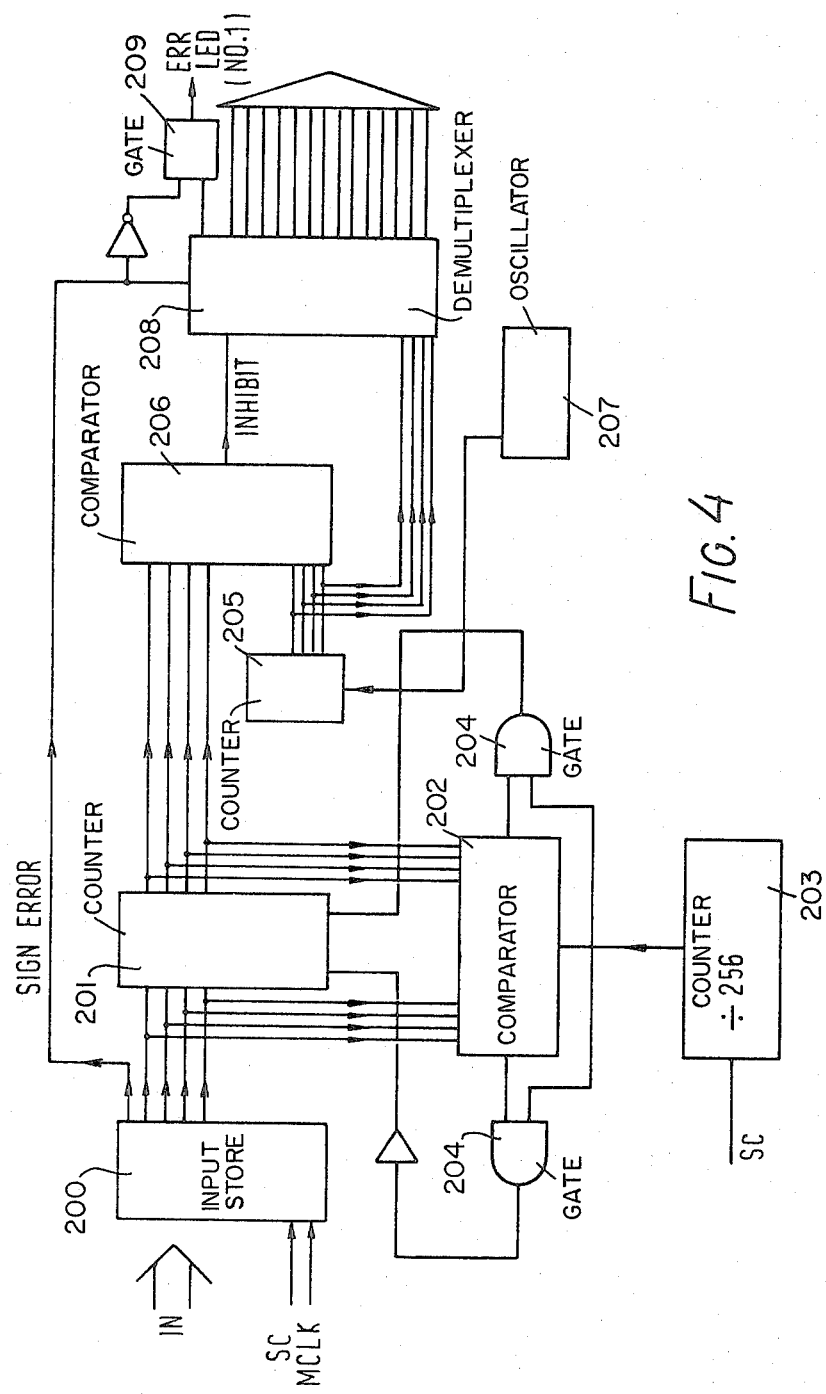
FIG. 4 shows a display means indicated at, Cr, in FIG. 1.

Referring now to FIG. 4, chip 200, which receives the incoming data from bus Z, has an eight bit field programmable address which is used to enable the input port of the chip to receive the data on the bus. Whilst the chip receives pulse SC, from the control means, B, the data received at the input port is treated as an address which is to be compared with that of its own internally programmed address. If the two addresses are matched when the first MCLK pulse is received then chip 200, on receipt of the second MCLK pulse, latches the data currently on the data bus, Z.

The data derived from the previous cycle, and which is currently being displayed by the display means is stored in a counter, 201. The new data, latched into chip, 200, is compared with that of counter, 201, using a comparator, 202, and if its value is found to be greater is loaded via gate, 204, into counter, 201, to update the data already there. If the value of the new data is less than the value in, 201, however, the count in 201 may be periodically decremented by one to produce a linear decay. Counter, 203, which receives the SC pulse from the control means, is used to determine the decay rate, which may clearly be set to a value of between 1 count every SC pulse or 1 count every 256 SC pulses (i.e. to coincide with each interrogation of the corresponding acquisition means).

In this example a DATA READY pulse is generated every 32 sampling periods, which, as described earlier, each have a duration of 20 μS. The control means, B, therefore, has a basic cycle time of 640 μS for every SC pulse, so that all 256 displays may be updated in a period 163.84 mS. When each display has 15 leds a full scale decay time to zero is selectable between 0.01024 secs (i.e. 16×640 μS) and 2.6214 secs (i.e. 16×256×640 μS). It is clearly possible by suitable adjustment of the clock control, to set the sampling periods and decay times to suit a particular requirement.

The value in counter, 201, which has been either updated or decremented, is passed to a chip, 206, for comparison with the value of another counter, 205, which is constantly driven by a free running oscillator, 207.

The output from 205 is passed to a demultiplexer, 208, which drives the 15 leds to display the value in 205. However, whenever, the value in 205 exceeds the value in 201 the demultiplexer is inhibited by a pulse INHIBIT so that the leds which would otherwise represent values higher than the value in 201 are not illuminated.

By driving the counter, 205, at a suitably high rate it is possible to create the appearance of an essentially continuous display.

A scale associated with the described display is shown in FIG. 5a, and is arranged on a linear scale and covers approximately the same range as a conventional VU meter.

In some applications it may be desirable to adjust the gain of the input signal, and whilst this does nothing to increase the signal to noise ratio it is necessary in order to optimise the signal levels during subsequent processing operations. Typically a gain of up to ±18dB may conveniently be achieved in 6dB steps by shifting the binary word to the right or left within the universal shift registers 11 and 12 of FIG. 2. This may be achieved by the application of suitable pulses to the logic circuitry enclosed within box 30. When shifting the word to the right (to reduce the signal level) the value of the most significant bit (MSB), the sign bit, is maintained at its correct value by flip-flop, 8, using the logic circuitry enclosed within box, 10, through which the input passes. However, when shifting the word to the left, the sign bit may be lost, resulting in a gross error. For example, if the original value of the word was 1011111, a shift of one place to the left produces the word, 0111111, which has the wrong sign value. An error of this type is detected using the flip-flop, 8, operating in conjunction with another flip-flop, 22. The gate, 23, receives both the original value of the sign bit from the output VII, of, 8, and the value of the second most significant bit before a shift to the left. If these two values differ, so that a sign error will occur at the next left shift, a gate, 24, sets flip-flop, 22, which is not reset until its contents have been transferred to the control means, B, during the next interrogation, to indicate the error.

This arrangement will also detect errors, even though the sign value is apparently correct. For example if the original word is 10111110 and the new value, after two left shifts, is 11111000, then although the sign is correct the word value is incorrect. To indicate an error in the data, a pulse SIGNERR, contained within flip-flop, 22, is transmitted to the appropriate display means via the control means, along with the absolute peak amplitude value of the data. Whenever the SIGNERR bit is high the top led (15th), the ERR LED, in the display is illuminated by gate, 209, but all the other leds are inhibited to provide a clearly visible and easily recognisable indication. The ERRLED may also be of a different colour or intensity.

In another arrangement an alternative display is provided and is indicated by FIG. 5b. If the most significant 7 bits of the peak absolute signal value (plus the SIGNERR bit) are fed to 8 legs, then a logarithmic display is possible. Control for this display is achieved by replacing the counter, 201, by a shift register, the decay being produced by successive right shifts, controlled by counter, 203. This produces a linear decay on a logarithmic scale, and consequently is more compact and covers a greater range than the linear scale.

It will be appreciated, of course, that it is possible to use more than 4 data bits (for the linear display system) or 7 bits (for the logarithmic display system) by increasing the capacity of components used.

It may also be convenient to provide several displays, indicating the same data, but in different locations on the console, and this can easily be achieved by providing identical address for more than one display means.

A display system is provided, therefore, which appears to the user to be similar in nature to the conventional bargraph type VU or PPM meter. The display presents the user with the important parameters in the digital signal channel; thus it indicates the peak signal level, and provides an indication of digital gain overloading, whilst maintaining visual correlation with the musical signal. This implementation requires a minimum amount of hardware and wiring for repeated displays and for expansion to extra channels. Also different decay rates and logarithmic or linear display scales can easily be accommodated.

What we claim is:

1. An arrangement for displaying a visual indication of the amplitude level of digital audio signals comprising,
    acquisition means for receiving digital audio signals and for generating therefrom further digital signals representitive of a characteristic of the amplitude of the digital audio signals received,
    control means for performing periodic interrogations of the output of the acquisition means and for transmitting said further signals to a display location,
    and display means comprising an input means, disposed at said display location, for receiving said transmitted further signals, means for providing a visual indication of the amplitude value level represented by said further signals, and means for causing said indicated value to decay at a predetermined rate if greater than the amplitude level represented by a signal subsequently transmitted to the input means, and to be substituted thereby if less.

2. An arrangement according to claim 1 wherein the control means periodically interrogates said acquisition means at intervals lying in the range 320 µS to 1280 µS.

3. An arrangement according to claims 1 or 2 wherein the means for causing said decay or substitution comprises a first counter means for storing the indicated amplitude value, storage means for storing the amplitude value of a subsequently received signal, means for comparing said values, a second counter means for reducing the indicated value at a predetermined rate if greater than the value stored in said storage means, and means for permitting substitution of the indicated value by the value stored in said storage means if less.

4. An arrangement according to claim 1 or 2 wherein the means for providing a visual indication of the amplitude level represented by said further signals comprises, a plurality of light emitting indicators, each indicator being identified with an amplitude level.

5. An arrangement according to claim 3 wherein the light emitting indicators are energised by a further counter means responsive to the value stored in said first counter means.

6. An arrangement according to claims 1 or 2 wherein the predetermined decay is logarithmic.

7. An arrangement according to claims 1 or 2 wherein the predetermined decay is linear.

8. An arrangement according to claims 1 or 2, said acquisition means comprising a plurality of acquisition units, said display means comprising a display unit for each acquisition unit, and said arrangement including means for causing the control means to repetitively interrogate each said acquisition unit in sequence.

9. An arrangement according to claim 4, wherein the means for causing said decay or substitution comprises a first counter means for storing the indicated amplitude value, and wherein the light emitting indicators are energised by a further counter means responsive to the value stored in said first counter means.

* * * * *